United States Patent
Yang et al.

(10) Patent No.: US 9,891,855 B2
(45) Date of Patent: Feb. 13, 2018

(54) MEMORY DEVICE CAPABLE OF ADJUSTING OPERATION VOLTAGE AND APPLICATION PROCESSOR FOR CONTROLLING THE MEMORY DEVICE

(71) Applicant: SAMSUNG ELECTRONICS CO., LTD., Suwon-si, Gyeonggi-do (KR)

(72) Inventors: Hui-Kap Yang, Hwaseong-si (KR); Myung-Kyoon Yim, Seoul (KR); Soo-Hwan Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/438,651

(22) Filed: Feb. 21, 2017

(65) Prior Publication Data
US 2017/0315747 A1    Nov. 2, 2017

(30) Foreign Application Priority Data
Apr. 29, 2016    (KR) .................. 10-2016-0053523

(51) Int. Cl.
*G06F 12/00*    (2006.01)
*G06F 3/06*    (2006.01)
(52) U.S. Cl.
CPC .......... *G06F 3/0634* (2013.01); *G06F 3/0614* (2013.01); *G06F 3/0673* (2013.01)
(58) Field of Classification Search
CPC ..... G06F 3/0634; G06F 3/0614; G06F 3/0673
USPC ................................................... 365/189.09
See application file for complete search history.

(56) References Cited

U.S. PATENT DOCUMENTS

| | | |
|---|---|---|
| 7,305,521 B2 | 12/2007 | Park |
| 7,412,613 B2 | 8/2008 | Park |
| 7,417,482 B2 | 8/2008 | Elgebaly et al. |
| 7,612,587 B2 | 11/2009 | Cheng |
| 8,135,968 B2 | 3/2012 | Kim |
| 8,245,057 B2 | 8/2012 | Lyu |
| 8,347,129 B2 | 1/2013 | Paik |

(Continued)

FOREIGN PATENT DOCUMENTS

| | | |
|---|---|---|
| KR | 10-2005-0008041 A | 1/2005 |
| KR | 10-2005-0082761 A | 8/2005 |

(Continued)

OTHER PUBLICATIONS

Choi, Kihwan, et al., "Dynamic Voltage and Frequency Scaling based on Workload Decomposition," Department of EE-Systems, University of Southern California, Los Angeles, CA 90089.

*Primary Examiner* — Han Yang
*Assistant Examiner* — Xiaochun L Chen
(74) *Attorney, Agent, or Firm* — Volentine & Whitt, PLLC

(57) ABSTRACT

A memory device is provided which is capable of adjusting an operation voltage, and an application processor is provided for controlling the memory device. The memory device may include: a receiving terminal for receiving a voltage control signal from an external source, the voltage control signal being for adjusting an operation voltage level according to an operation speed of the memory device; and a voltage adjustment unit for adjusting a level of an operation voltage of the memory device in response to the voltage control signal. The level of the operation voltage is adjusted before a memory operation is performed at the operation speed corresponding to the adjusted operation voltage.

20 Claims, 23 Drawing Sheets

(56) References Cited

U.S. PATENT DOCUMENTS

| | | |
|---|---|---|
| 8,566,618 B2 | 10/2013 | Floyd et al. |
| 8,631,262 B2 | 1/2014 | Park |
| 8,811,095 B2 | 8/2014 | Tsern et al. |
| 9,626,307 B2 * | 4/2017 | Kim ...................... G06F 13/102 |
| 2009/0027990 A1 | 1/2009 | Houston |
| 2010/0138684 A1 | 6/2010 | Kim et al. |
| 2011/0080202 A1 | 4/2011 | Moore et al. |
| 2014/0068285 A1 | 3/2014 | Lee et al. |
| 2014/0089697 A1 | 3/2014 | Kim et al. |
| 2014/0113690 A1 | 4/2014 | Shanmugasundaram et al. |
| 2014/0129857 A1 | 5/2014 | Park |
| 2014/0281594 A1 | 9/2014 | Yang et al. |
| 2014/0324245 A1 | 10/2014 | Kwon et al. |
| 2014/0325247 A1 | 10/2014 | Sodhi et al. |
| 2015/0026398 A1 | 1/2015 | Kim |

FOREIGN PATENT DOCUMENTS

| | | |
|---|---|---|
| KR | 10-2008-0091092 A | 10/2008 |
| KR | 10-1020-0046414 | 5/2010 |
| KR | 1020100046414 | 5/2010 |
| KR | 10-2010-0081130 | 7/2010 |
| KR | 10-2010-0124928 A | 11/2010 |
| KR | 10-2011-0037871 A | 4/2011 |
| KR | 10-2011-0050010 | 5/2011 |

\* cited by examiner

FIG. 14A

| CMD | | OUTPUT OF PMIC | CLOCK CONTROL OF DVFS CONTROLLER |
|---|---|---|---|
| CPU | CPU_A | VDD1 | CLK1 |
| | CPU_B | VDD2 | CLK2 |
| | CPU_C | VDD3 | CLK3 |
| | CPU_D | VDD4 | CLK4 |
| Peri | Peri_A | VDD1 | CLK1 |
| | Peri_B | VDD2 | CLK2 |
| MCU | MCU_A | VDD1 | CLK1 |
| | MCU_B | VDD2 | CLK2 |
| | MCU_C | VDD3 | CLK3 |

FIG. 14B

Dev_Info

| MANUFACTURING COMPANY |
| PRODUCT NAME |
| Process Revision ID |
| VOLTAGE CORRESPONDING TO PROCESS REVISION ID |

[ High freq. → Low freq. ]
 (2G)           (1G)

MEMORY DEVICE CAPABLE OF ADJUSTING OPERATION VOLTAGE AND APPLICATION PROCESSOR FOR CONTROLLING THE MEMORY DEVICE

CROSS-REFERENCE TO RELATED APPLICATION

This application claims the benefit of Korean Patent Application No. 10-2016-0053523, filed on Apr. 29, 2016 in the Korean Intellectual Property Office, the disclosure of which is incorporated herein in its entirety by reference.

BACKGROUND

The inventive concept relates to a memory device, and more particularly, to a memory device capable of adjusting an operation voltage, and an application processor for controlling the memory device.

The capacity and speed of semiconductor memory devices used in high performance electronic systems have increased. An example of a semiconductor memory device is a dynamic random access memory (DRAM), which is a type of volatile memory that stores data in a capacitor as an electric charge.

A mobile system employs an application processor (AP) to control a semiconductor memory device and other various devices, and a power management integrated circuit (PMIC) to manage the power of various functional blocks in the application processor. The PMIC provides a constant power source voltage to the semiconductor memory device in the mobile system, but is required to efficiently manage the supply of power without deteriorating an operation performance of the semiconductor memory device.

SUMMARY

The inventive concept provides an application processor capable of managing a memory device to adjust a level of an operation voltage at an appropriate timing in response to a variation in an operation speed by predicting the operation speed of the memory device.

The inventive concept provides an operating method of the memory device which may prevent a deterioration of operation characteristics of the memory device which is caused when the operation voltage of the memory device is not changed to an operation voltage appropriate to the operation speed at the appropriate timing.

According to an aspect of the inventive concept, there is provided a memory device including a receiving terminal configured to receive from an external source a voltage control signal for adjusting a level of an operation voltage in the memory device according to an operation speed of the memory device, and a voltage adjustment unit configured to adjust the level of the operation voltage of the memory device in response to the voltage control signal. The level of the operation voltage is adjusted before a memory operation is performed at the operation speed corresponding to the level-adjusted operation voltage.

According to another aspect of the inventive concept, there is provided an application processor including a memory controller controlling a memory operation of a memory device, a dynamic voltage and frequency scaling (DVFS) controller receiving status information associated with an operation speed from the memory controller, outputting a power adjustment command based on the status information to adjust a power source voltage provided to the memory controller, and outputting a voltage control signal based on the status information to adjust a level of an operation voltage of the memory device, and at least one output terminal providing the voltage control signal to the memory device.

According to yet another aspect of the inventive concept, an application processor comprises: a memory controller configured to control a memory operation of a memory device; a dynamic voltage and frequency scaling (DVFS) controller configured to: receive status information associated with an operation speed from the memory controller, output a first signal, based on the status information, for adjusting a power source voltage provided from an external device to the memory controller, and output a second signal, based on the status information, for adjusting a level of an operation voltage of the memory device; and one or more output terminals configured to output the first and second signals.

BRIEF DESCRIPTION OF THE DRAWINGS

Embodiments of the inventive concept will be more clearly understood from the following detailed description taken in conjunction with the accompanying drawings.

FIGS. 14A and 14B illustrate embodiments of table information and device information associated with a level of an operation voltage corresponding to an operation speed.

DETAILED DESCRIPTION OF THE EMBODIMENTS

Figure 1:
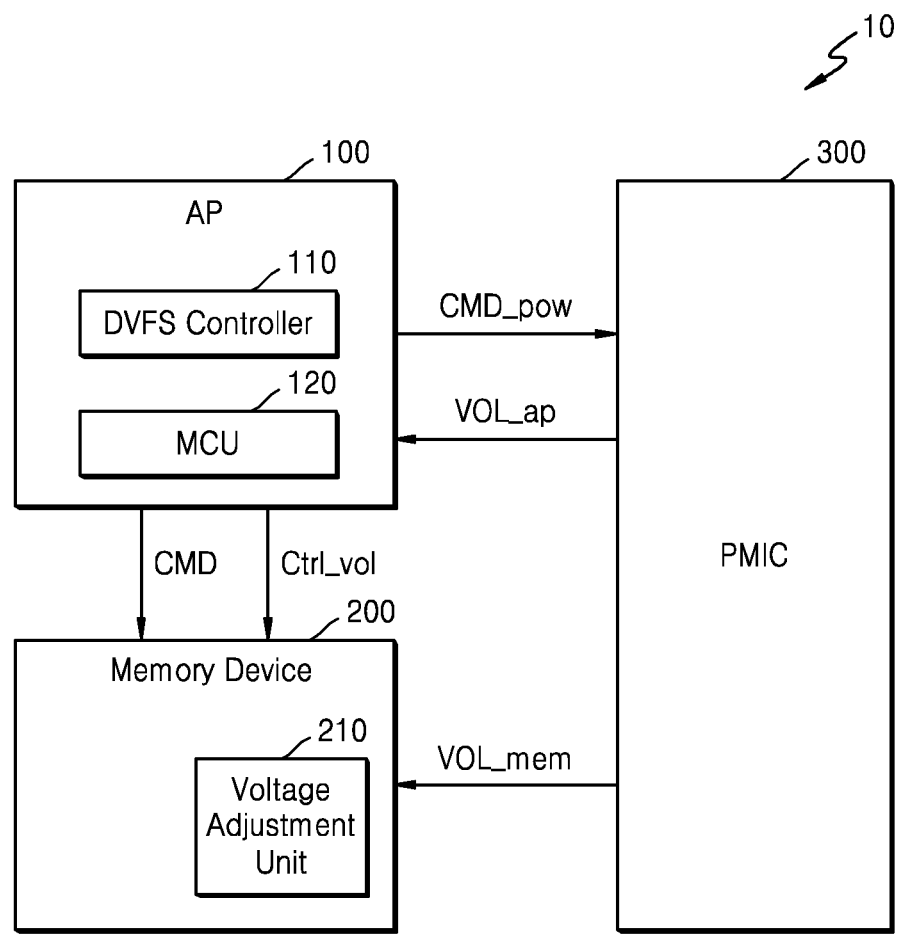
FIG. 1 is a block diagram showing an embodiment of a data processing system.

As is traditional in the field of the inventive concepts, some embodiments and/or components thereof are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a block diagram showing an embodiment of a data processing system 10.

Referring to FIG. 1, data processing system 10 may include an application processor 100, a memory device 200, and a power management integrated circuit (PMIC) 300. Data processing system 10 shown in FIG. 1 may be implemented on various computing systems. According to an embodiment, data processing system 10 may be a mobile system including application processor 100.

Data processing system 10 may include various types of memory devices 200. Memory device 200 may be a semiconductor device of various types in various embodiments. According to an embodiment, memory device 200 may be a dynamic random access memory (DRAM), such as double data rate synchronous dynamic random access memory (DDR SDRAM), low power double data rate (LPDDR) SDRAM, graphics double data rate (GDDR) SDRAM, rambus dynamic random access memory (RDRAM), etc.

Application processor 100 may be a system-on-chip (SoC). The system-on-chip (SoC) may include a system bus (not shown) operating according to a protocol based on a predetermined standard bus specification and various intellectual property cores connected to the system bus. The standard specification of the system bus may be an advanced microcontroller bus architecture (AMBA) protocol of Advanced RISC Machine (ARM). The bus type of AMBA protocol includes Advanced High-performance Bus (AHB), Advanced Peripheral Bus (APB), Advanced eXtensible Interface (AXI), AXI4, AXI Coherency Extension (ACE), and the like. In addition, other types of protocols, such as uNetwork of SONICs Inc., CoreConnect of IBM, Open Core Protocol of OCP-IP, etc., may be used.

Application processor 100 may include a dynamic voltage and frequency scaling (DVFS) controller 110 and a memory controller (or, a memory control unit (MCU)) 120. DVFS controller 110 may determine an operation status of various functional blocks and apply a power adjustment command CMD_pow to PMIC 300 to adjust a power of the functional blocks. PMIC 300 controls a level of a power source voltage Vol_ap applied to the functional blocks in application processor 100 in response to the power adjustment command CMD_pow.

In addition, memory controller 120 may access memory device 200. According to an embodiment, memory controller 120 may write data in memory device 200 or read out data from memory device 200 in accordance with an operation of application processor 100. Memory controller 120 may interface with memory device 200 and provide various commands CMD, such as a write command, a read command, etc., to memory device 200 with regard to a memory operation.

According to an embodiment, application processor 100 may apply a voltage control signal Ctrl_vol to memory device 200. According to an embodiment, DVFS controller 110 of application processor 100 may generate the voltage control signal Ctrl_vol and apply the voltage control signal Ctrl_vol to memory device 200. According to an embodiment, application processor 100 may include one or more output terminals (e.g., dedicated terminals) for communication between DVFS controller 110 and memory device 200, and the voltage control signal Ctrl_vol is directly applied to memory device 200 from DVFS controller 110 through the output terminals.

According to another embodiment, the voltage control signal Ctrl_vol is applied to memory device 200 through memory controller 120. According to an embodiment, memory controller 120 generates a command (e.g., a voltage control command) appropriate to an interface between memory controller 120 and memory device 200 in accordance with the voltage control signal Ctrl_vol and outputs the generated voltage control command as the voltage control signal Ctrl_vol through an interface unit in memory controller 120. As an example, application processor 100 includes a plurality of output terminals (e.g., memory terminals) implementing a communication between the interface unit of memory controller 120 and memory device 200, and the voltage control signal Ctrl_vol is applied to memory device 200 through at least one of these output terminals.

Memory device 200 may include a voltage adjustment unit 210. Memory device 200 may receive a power source voltage Vol_mem from PMIC 300 and adjust a level of the power source voltage Vol_mem. That is, voltage adjustment unit 210 adjusts a level of the power source voltage Vol_mem received from PMIC 300, and thus voltage adjustment unit 210 adjusts a level of an operation voltage applied to various circuit blocks in memory device 200.

According to an embodiment, voltage adjustment unit 210 adjusts the level of the power source voltage Vol_mem in response to the voltage control signal Ctrl_vol received from application processor 100, and thus the adjusted operation voltage may be generated. According to an embodiment, memory device 200 may perform a memory operation in a plurality of operation statuses, and perform a high-speed memory operation or a low-speed memory operation in accordance with the operation statuses. In addition, a range of the level of the operation voltage required for each of the operation statuses may be previously set. According to an embodiment, memory device 200 may be operated at a high frequency and high voltage during a high-speed memory operation, and operated at a low frequency and low voltage during a low-speed memory operation.

According to an embodiment, application processor 100 may determine (or predict) the operation speed of memory device 200 and output the voltage control signal Ctrl_vol to memory device 200 on the basis of the determined result. According to an embodiment, memory controller 120 and memory device 200 may be operated in the same frequency domain (or at the same speed), and thus the operation speed of memory device 200 may be determined by checking the operation status of memory controller 120.

According to an embodiment, DVFS controller 110 may receive information (hereinafter, referred to as status information) associated with the operation status from memory controller 120 and output the voltage control signal Ctrl_vol with reference to the received status information to control the level of the operation voltage of memory device 200. According to an embodiment, memory controller 120 may check a workload on memory device 200 and determine whether to perform a high-speed memory operation or a low-speed memory operation according to a degree of the checked workload.

According to an embodiment, memory controller 120 may include a command queue (not shown) in which commands requesting one or more memory operations are stored, and may check the workload depending on the number of commands stored in the command queue. For instance, if the number of commands stored in the command queue is large, memory controller 120 may perform a high-speed memory operation on commands output at a current time or after a predetermined time. On the other hand, if the number of commands stored in the command queue is small, memory controller 120 may perform a low-speed memory operation on the commands output at the current time or after the predetermined time.

Memory controller 120 may provide the status information associated with the operation status to DVFS controller 110. According to an embodiment, if the operation status is changed to the high-speed (fast) status from the low-speed (slow) status, memory controller 120 may output the status information to DVFS controller 110 and provide a clock signal having a high frequency to memory device 200, and thus, the high-speed memory operation may be performed. According to another embodiment, memory controller 120 may output the status information to DVFS controller 110, and after a predetermined time lapses, memory controller 120 may provide the clock signal having the high frequency to memory device 200. Accordingly, the high-speed memory operation may be performed.

Similarly, when the operation status is changed to the low-speed status from the high-speed status, memory controller 120 may provide the clock signal to memory device 200 at a time point when memory controller 120 outputs the status information to DVFS controller 110 or after a predetermined time lapses from the time point when the operation status changes.

When the status information is provided to DVFS controller 110 from memory controller 120, DVFS controller 110 may determine the level of the operation voltage appropriate to memory device 200 in accordance with the received status information and generate the voltage control signal Ctrl_vol to control the level of the operation voltage of memory device 200.

According to the above-mentioned embodiment, memory device 200 may control the level of the operation voltage in response to the voltage control signal Ctrl_vol before the operation speed is changed. That is, since memory device 200 may control the level of the operation voltage in response to the voltage control signal Ctrl_vol before the frequency of the clock signal applied thereto is changed (or the operation speed of the memory is changed), the operation speed and the operation voltage of memory device 200 may be prevented from being mismatched with each other. In addition, according to the embodiment, memory device 200 may control the level of the operation voltage using the voltage control signal Ctrl_vol and a detection result of the frequency of the clock signal, and thus a deterioration of operating characteristics, which is caused when the operation speed and the level of the operation voltage do not match each other, may be prevented.

Figure 2:
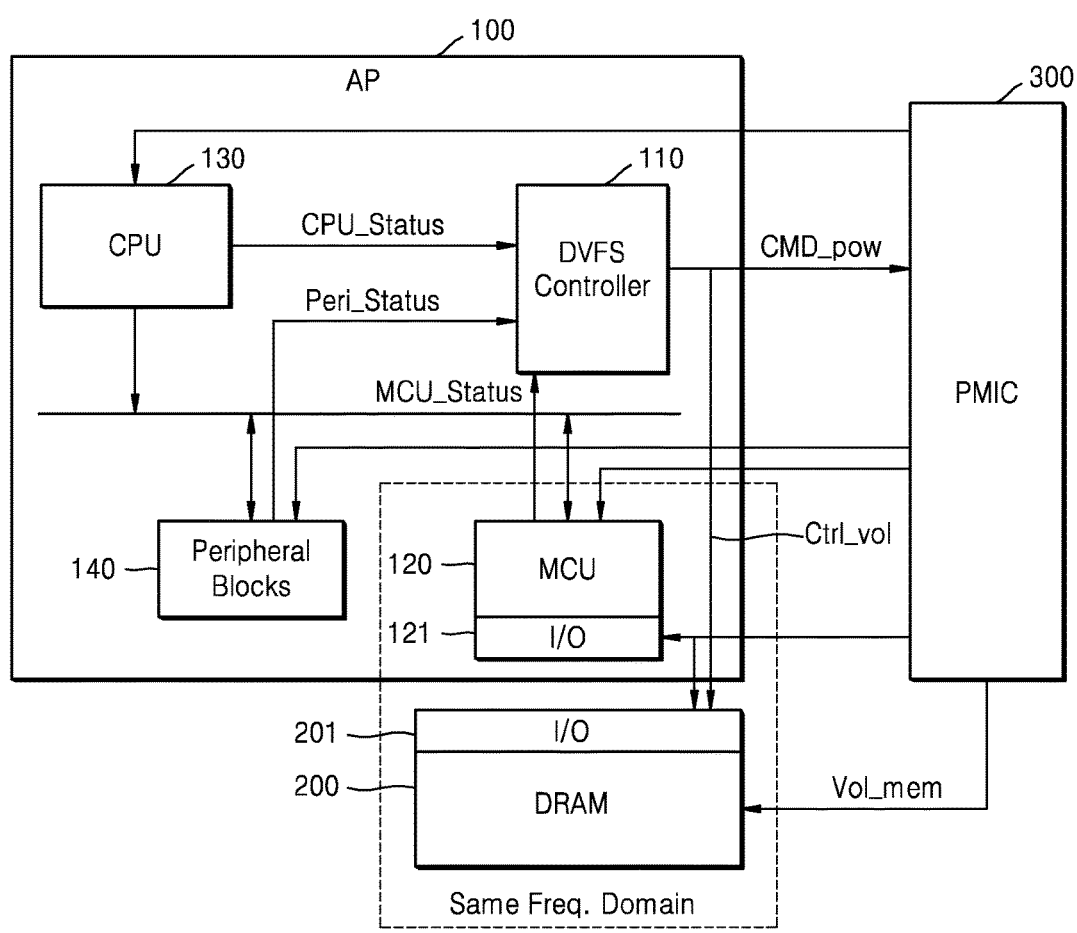
FIG. 2 is a block diagram showing an example of implementing an application processor of FIG. 1.

FIG. 2 is a block diagram showing an example of implementing of application processor 100 of FIG. 1.

Referring to FIGS. 1 and 2, application processor 100 may include DVFS controller 110, memory controller 120, a central processing unit (CPU) 130, and peripheral blocks 140. The various functional blocks of application processor 100 may communicate with each other through a system bus.

Central processing unit 130 may control the various functional blocks in application processor 100. In addition, central processing unit 130 may provide a data access request to memory device 200 through memory controller 120. Peripheral blocks 140 may correspond to ancillary blocks other than central processing unit 130, and as an example, peripheral blocks 140 may include various types of functional blocks, such as an input/output (I/O) interface block, a universal serial bus (USB) host block, a universal serial bus (USB) slave block, etc.

Memory controller 120 may output a command to memory device 200 in accordance with the request from central processing unit 130. Memory controller 120 may communicate with memory device 200 through an input/output block 121, and input/output block 121 may include an interface unit (not shown) interfacing with memory device 200. Similar to the above, memory device 200 may communicate with memory controller 120 through an input/output block 201, and input/output block 210 may include an interface unit (not shown) interfacing with memory controller 120. In addition, according to an embodiment, memory device 200 may communicate (e.g., directly) with another functional block, e.g., DVFS controller 110, in application processor 100, and in this case, input/output block 201 may further include a circuit to communicate with DVFS controller 110.

Application processor 100 may include one or more input/output terminals (for example, first terminals) allocated for the communication between memory controller 120 and memory device 200. Memory controller 120 may provide a command and an address to memory device 200 through the first terminals and may transmit/receive data to/from memory device 200 through the first terminals. According to an embodiment, in the case that the voltage control signal Ctrl_vol used to request the change of the operation voltage of memory device 200 is provided through input/output block 121 of memory controller 120, the voltage control signal Ctrl_vol may be provided to memory device 200 through one or more of the first terminals.

According to another embodiment, application processor 100 may further include at least one additional input/output terminal (for example, a second terminal) to communicate with memory device 200. In addition, memory device 200 may further one or more additional input/output terminals (for example, third terminals) to transmit/receive a signal to/from memory controller 120. In addition, memory device 200 may further include at least one additional input/output terminal (for example, a fourth terminal) to directly communicate with DVFS controller 110. For instance, memory device 200 may further include the fourth terminal to communicate with DVFS controller 110 in addition to the third terminals used to communicate with memory control unit 120. Application processor 100 may provide various information to memory device 200 through one or more second terminals. According to an embodiment, the voltage control signal Ctrl_vol used to request the change of the operation voltage of memory device 200 may be provided to memory device 200 through the second and fourth terminals.

DVFS controller 110 may provide the power adjustment command CMD_pow to PMIC 300 to adjust the power in accordance with the operation speed of each of the functional blocks in application processor 100. DVFS controller 110 may receive the status information from each of the functional blocks in application processor 100 and may determine or predict the operation speed of each of the functional blocks on the basis of the received status information. As described above, the operation speed may be determined or predicted according to the status information associated with the workload of each of the functional blocks.

According to an embodiment, DVFS controller 110 may receive the status information MCU_Status from memory controller 120 and may provide the power adjustment command CMD_pow to adjust a level of a power source voltage provided to memory controller 120. In addition, DVFS controller 110 may receive the status information CPU_Status from central processing unit 130 and may provide the power adjustment command CMD_pow to PMIC 300 to adjust the level of the power source voltage provided to central processing unit 130. In addition, DVFS controller 110 may receive status information Peri_Status from peripheral blocks 140 and may provide the power adjustment command CMD_pow to PMIC 300 to adjust the level of the power source voltage provided to peripheral blocks 140.

Memory controller 120 and memory device 200 may be operated in the same frequency domain, and thus the operation speed of memory controller 120 may be the same as the operation speed of memory device 200. Accordingly, DVFS controller 110 may determine the operation speed of memory controller 120 and memory device 200 in accordance with status information MCU_Status from memory controller 120.

DVFS controller 110 may provide the power adjustment command CMD_pow to PMIC 300 in accordance with the determined operation speed to adjust the level of the power source voltage provided to memory controller 120. In addition, PMIC 300 may provide the power source voltage Vol_mem having a constant level to memory device 200 corresponding to an external configuration of application processor 100, and the DVFS controller 110 may provide the voltage control signal Ctrl_vol to memory device 200 to allow memory device 200 to be requested to adjust the level of the operation voltage in memory device 200.

Memory device 200 may adjust the level of the power source voltage Vol_mem from PMIC 300 in response to the voltage control signal Ctrl_vol and may generate the level-adjusted internal voltage as the operation voltage. According to the above-mentioned embodiment, memory device 200 may previously adjust the level of the operation voltage before the operation speed is changed (or before the frequency of the clock signal provided from memory controller 120 is changed).

In addition, according to the above-mentioned embodiment, memory device 200 may set an adjustment time point of the level of the operation voltage in various ways in response to the change of the operation speed. For instance, in the case that the voltage control signal Ctrl_vol is a signal requesting an increase of the level of the operation voltage, memory device 200 may increase the level of the operation voltage before the operation speed actually increases, and thus the high-speed memory operation may be stably performed. In addition, in the case that the voltage control signal Ctrl_vol is a signal requesting a decrease of the level of the operation voltage, memory device 200 may decrease the level of the operation voltage at the time point at which the operation speed decreases (or at the time point at which the clock signal having the low frequency is received) without previously decreasing the level of the operation voltage, and thus the high-speed memory operation may be stably performed.

Figure 3A:
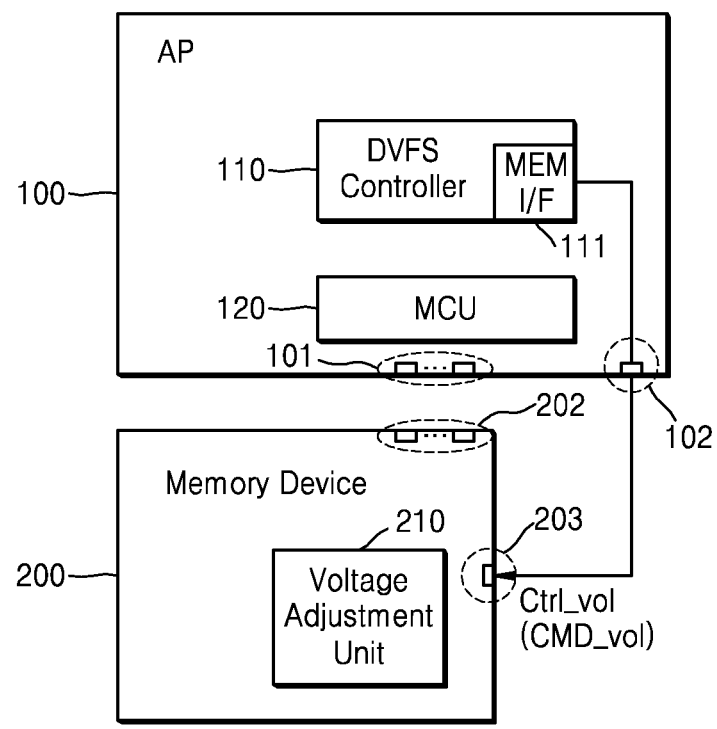
FIGS. 3A and 3B are block diagrams showing an example of transmission of a voltage control signal.
Figure 3B:
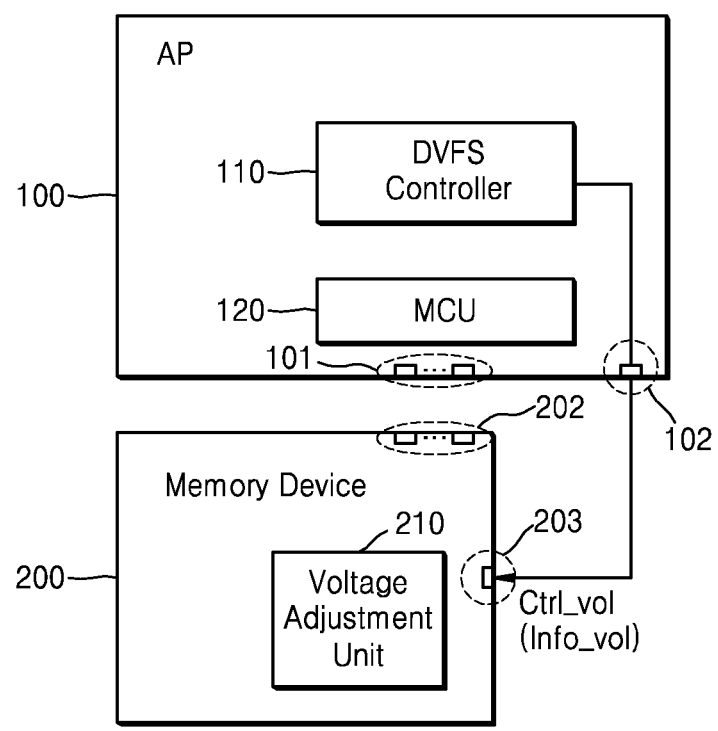

FIGS. 3A and 3B are block diagrams showing an example of transmission of the voltage control signal Ctrl_vol.

Referring to FIG. 3A, application processor 100 may include DVFS controller 110 and memory controller 120, and DVFS controller 110 may include a memory interface 111 to communicate with external memory device 200. In this application when we say that a first element or device is "external" to a second element or device, we mean that the first element or device is not included on a same semiconductor die as the second element or device. Thus, for example, when we say that a memory device receives a signal from an external source, we mean that the external source is not included in a same semiconductor die as the memory device. In addition, application processor 100 may include a plurality of terminals communicated with memory device 200. For instance, application processor 100 may include one or more first terminals 101 implementing the communication between memory controller 120 and memory device 200 and one or more second terminals 102 implementing the communication between DVFS controller 110 and memory device 200.

DVFS controller 110 may output the voltage control signal Ctrl_vol to memory device 200 through second terminal(s) 102, and memory device 200 may include voltage adjustment unit 210 adjusting the level of the operation level in response to the voltage control signal Ctrl_vol.

Memory interface 111 of DVFS controller 110 may interface with memory device 200, and for example, memory interface 111 may provide a command in accordance with the interface type between memory controller 120 and memory device 200 to memory device 200 as the voltage control signal Ctrl_vol. As an example, memory interface 111 may provide a voltage control command CMD_vol in a command form to memory device 200 through second terminal(s) 102 as the voltage control signal Ctrl_vol.

Memory device 200 may include one or more third terminals 202 to transmit/receive a signal to/from memory controller 120 and one or more fourth terminals 203 to transmit/receive a signal to/from DVFS controller 110. Memory device 200 may transmit and receive command, address, and data through third terminals 202, and receive the voltage control command CMD_vol from application processor 100 through fourth terminal(s) 203.

Referring to FIG. 3B, DVFS controller 110 may provide voltage adjustment information Info_vol including one or more bits to memory device 200 as the voltage control signal Ctrl_vol. In this case, memory device 200 may receive the voltage adjustment information Info_vol through fourth terminal(s) 203.

Figure 4:
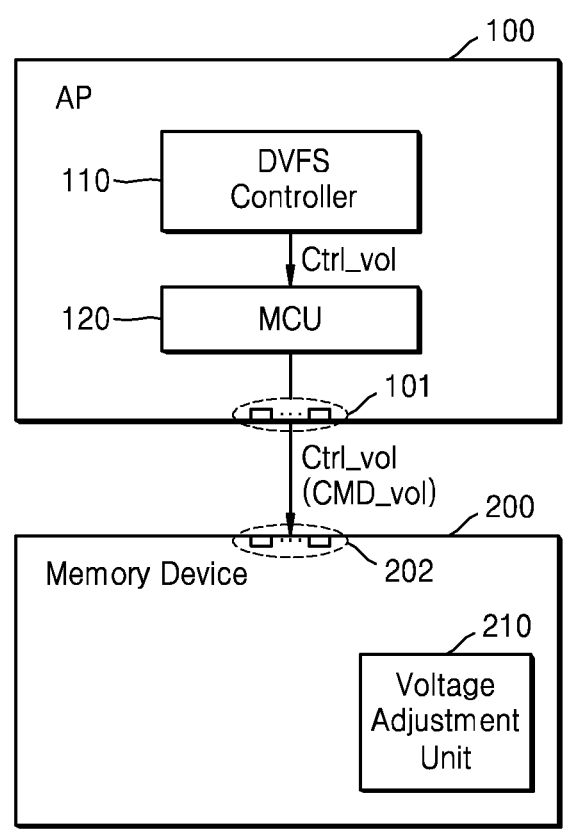
FIG. 4 is a block diagram showing another example of transmission of the voltage control signal.

FIG. 4 is a block diagram showing another example of the transmission of the voltage control signal Ctrl_vol. In FIG. 4, the voltage control signal Ctrl_vol may be provided to memory device 200 through memory controller 120.

Referring to FIG. 4, DVFS controller 110 may provide the voltage control signal Ctrl_vol to memory controller 120, and memory controller 120 may output the voltage control signal Ctrl_vol to memory device 200 through one or more first terminals 101. Memory controller 120 may include an interface unit (not shown) communicating with memory device 200, and the voltage control command CMD_vol in the command form may be provided to memory device 200 through one or more first terminals 101 as the voltage control signal Ctrl_vol. Memory device 200 may receive the voltage control signal Ctrl_vol through one or more second terminals 202 used to interface with memory controller 120.

Figure 5:
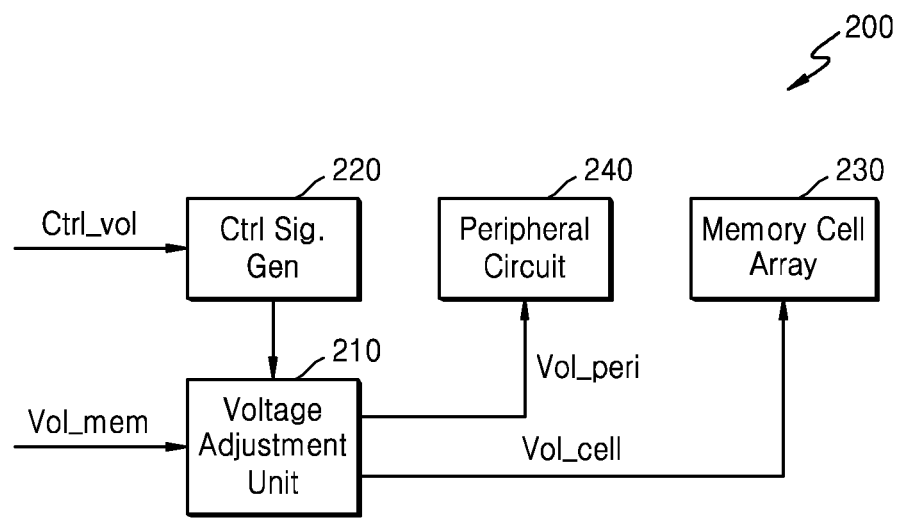
FIG. 5 is a block diagram showing an example of implementing a memory device of FIG. 1.

FIG. 5 is a block diagram showing an example of implementation of a memory device of FIG. 1.

Referring to FIG. 5, a memory device 200 may include a voltage adjustment unit 210, a control signal generator 220, a memory cell array 230, and a peripheral circuit 240.

Memory device 200 may receive the power source voltage Vol_mem from a PMIC (e.g., PMIC 300), and voltage adjustment unit 210 may adjust the level of the power source voltage Vol_mem in response to the voltage control signal Ctrl_vol from an application processor (e.g., application processor 100) to generate various internal voltages. Memory cell array 230 may include a plurality of memory cells storing data, and peripheral circuit 240 may include various types of circuits associated with writing the data to, and reading the data from, memory cell array 230. Voltage adjustment unit 210 may generate a cell voltage Vol_cell provided to memory cell array 230 and a peripheral voltage Vol_peri provided to peripheral circuit 240 as internal voltages, and may adjust a level of the cell voltage Vol_cell and/or the peripheral voltage Vol_peri.

According to an embodiment, control signal generator 220 may receive the voltage control signal Ctrl_vol from the application processor, process the voltage control signal Ctrl_vol, and provide the processed result of the voltage control signal Ctrl_vol to voltage adjustment unit 210. According to an embodiment, in a case that the voltage control signal Ctrl_vol corresponds to the voltage control command, control signal generator 220 may have a configuration that executes a command decoding function. In the case that the voltage control signal Ctrl_vol communicates information via one or more bits, control signal generator 220 may have a configuration that generates an internal control signal according to value(s) of the one or more bits.

Figure 6:
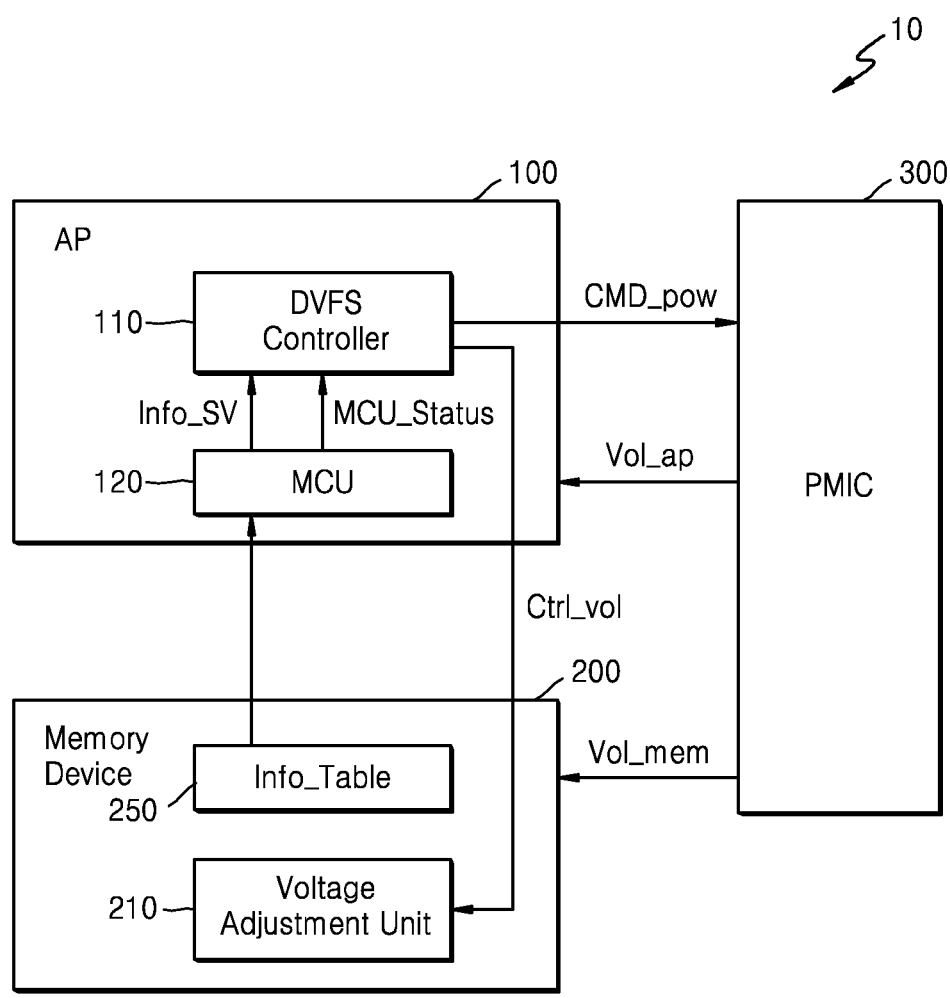
FIG. 6 is a block diagram showing an example in which a memory device provides table information to an application processor.

FIG. 6 is a block diagram showing an example of a data processing system 10a in which a memory device provides table information to an application processor. Detailed descriptions of elements in FIG. 6 which are the same as in above-mentioned embodiments will be omitted.

Referring to FIG. 6, a memory device 200a may include voltage adjustment unit 210 and a table information storing unit 250. Table information storing unit 250 may store table information associated with a range of the operation voltage according to an operation speed of memory device 200. As an example, in the case that memory device 200 is operated at a certain operation speed, memory device 200 may be set to operate according to the operation voltage having a level within a predetermined range. In addition, as an example, the table information may include speed-voltage information Info_SV indicating the range of the operation voltages respectively corresponding to operation speeds with plural levels. As another example, table information storing unit 250 may be implemented by a storing member (e.g., a fuse array) that non-volatilely stores information.

When data processing system 10 is initially operated or normally operated, the speed-voltage information Info_SV stored in table information storing unit 250 may be read out and may be provided to DVFS controller 110. In addition, as described above, memory controller 120 may provide the status information MCU_Status associated with the operation speed to DVFS controller 110. DVFS controller 110 may ascertain or determine the level of the proper operation voltage corresponding to the operation speed of memory controller 120 through the status information MCU_Status and the speed-voltage information Info_SV. DVFS controller 110 may provide the power adjustment command CMD_Pow to PMIC 300 to adjust the level of the power source voltage provided to memory controller 120. In addition, DVFS controller 110 may provide the voltage control signal Ctrl_vol to memory device 200 to adjust the level of the operation voltage in memory device 200.

Figure 7:
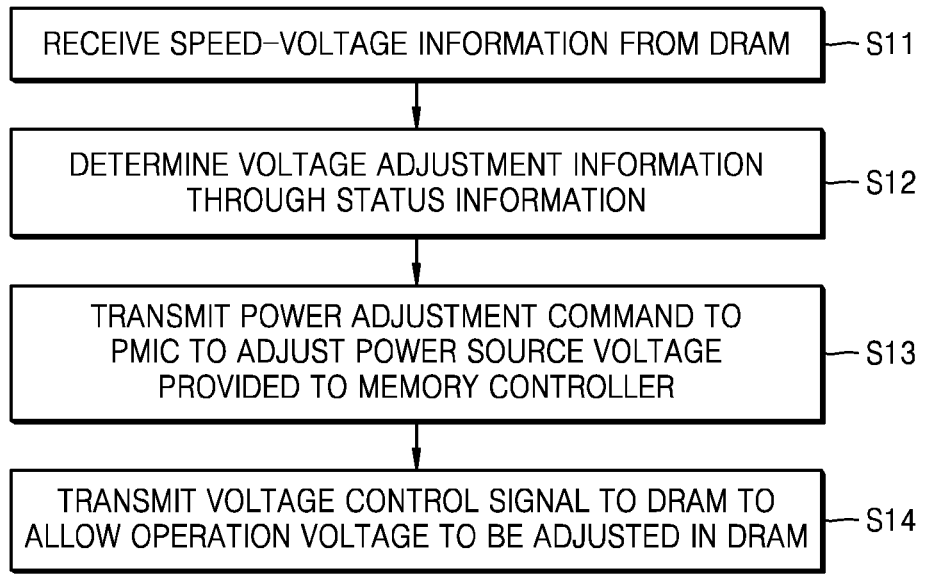
FIG. 7 is a flowchart of an embodiment of an operating method of an application processor.

FIG. 7 is a flowchart of an embodiment of an operating method of an application processor. FIG. 7 illustrates an example wherein memory device 200 is implemented by a DRAM.

Referring to FIGS. 1 and 7, application processor 100 may receive the table information from DRAM 200. The table information may include the speed-voltage information according to the operation status of DRAM 200 (S11). As an example, the speed-voltage information may be information indicating the level of the operation voltage corresponding to the frequency of the operation clock signal.

Memory controller 120 of application processor 100 may predict (or determine) the speed of the memory operation, and as an example, memory controller 120 may predict the speed of the memory operation in accordance with the workload. For instance, memory controller 120 may determine that the speed of the memory operation is changed at the current time point or after a predetermined time lapses and may provide the status information MCU_Status associated with the determined operation speed of the memory controller 120 to DVFS controller 110.

DVFS controller 110 may determine the voltage adjustment information with respect to memory controller 120 and DRAM 200 with reference to the table information and the status information MCU_Status (S12). According to the determined result, DVFS controller 110 may provide the power adjustment command CMD_Pow to PMIC 300 to adjust the power source voltage provided to memory controller 120 (S13). In addition, DVFS controller 110 may provide the voltage control signal Ctrl_vol to DRAM 200 to allow the level of the operation voltage to be adjusted in DRAM 200 (S14).

Figure 8:
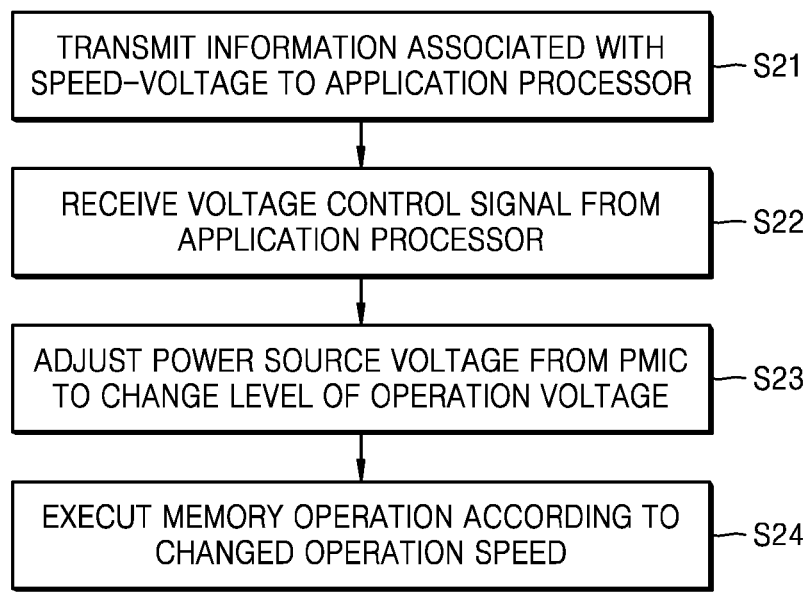
FIG. 8 is a flowchart of an embodiment of an operating method of a memory device.

FIG. 8 is a flowchart of an embodiment of an operating method of a memory device. FIG. 8 illustrates an example wherein memory device 200 is implemented by a DRAM.

Referring to FIGS. 1 and 8, DRAM 200 may transmit the table information, including the speed-voltage information corresponding to the operation status of DRAM 200, to application processor 100 (S21). In addition, DRAM 200 may execute one or more memory operations in accordance with a clock signal provided from application processor 100 and the power source voltage provided from PMIC 300, and as an example, DRAM 200 may be operated at high-speed or low-speed in accordance with the clock signal provided from memory controller 120 in application processor 100.

The voltage control signal Ctrl_vol may be output from application processor 100 according to the predicted or determined result of the speed of the memory operation of DRAM 200, and DRAM 200 may receive the voltage control signal Ctrl_vol (S22). DRAM 200 may change the level of the operation voltage by adjusting the level of the power source voltage provided from PMIC 300 in accordance with the voltage control signal Ctrl_vol (S23), and then DRAM 200 may execute the memory operation in accordance with the changed operation speed in a state in which the level of the internal voltage is changed since the frequency of the clock signal provided from application processor 100 (S24).

Figure 9:
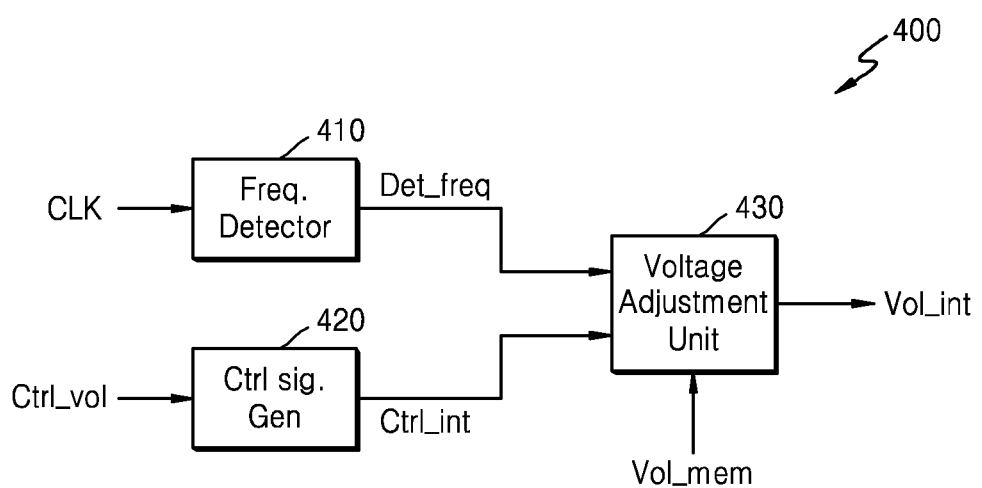
FIG. 9 is a block diagram showing an example embodiment of implementing a memory device.

FIG. 9 is a block diagram showing an example embodiment of implementing a memory device.

Referring to FIG. 9, a memory device 400 may include a frequency detector 410, a control signal generator 420, and a voltage adjustment unit 430. Frequency detector 410 may receive a clock signal CLK provided from an application processor (e.g., application processor 100) and may detect a frequency of the clock signal CLK. In addition, control signal generator 420 may receive the voltage control signal Ctrl_vol provided from the application processor and may execute a processing operation with respect to the voltage control signal Ctrl_vol. Control signal generator 420 may output an internal control signal Ctrl_int to increase or decrease the level of the operation voltage according to the processed result.

Voltage adjustment unit 430 may adjust the level of the power source voltage Vol_mem in accordance with the detected result Det_freq from frequency detector 410 and the internal control signal Ctrl_int provided from control signal generator 420, and may generate the operation voltage Vol_int in which the level thereof is adjusted. The level-adjusted operation voltage Vol_int may be applied to various circuits in memory device 400. According to an embodiment, voltage adjustment unit 430 may change a timing, at which the level of the operation voltage Vol_int is adjusted, in accordance with the detected result Det_freq and the inner control signal Ctrl_int.

Figure 10A:
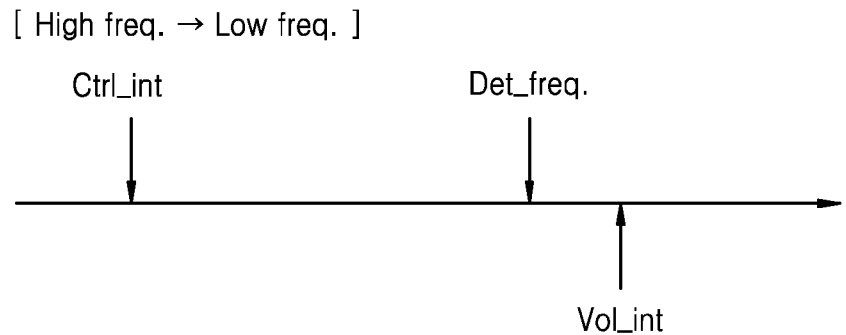
FIGS. 10A and 10B illustrate example timing arrangements for adjusting an operation voltage of a memory device.
Figure 10B:
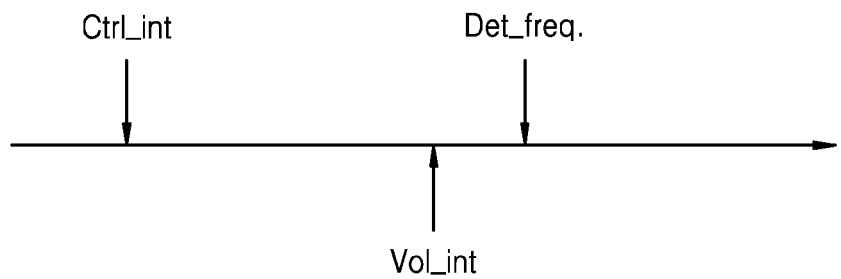

FIGS. 10A and 10B illustrate example timing arrangements for adjusting an operation voltage of a memory device, such as memory device 400. Hereinafter, various examples describing the timing of level adjustment of the operation voltage will be described with reference to FIGS. 9, 10A, and 10B.

FIG. 10A shows an example in which an operation speed of memory device 400 is changed from the high-speed to the low-speed. Memory device 400 receives the voltage control signal Ctrl_vol from the application processor (e.g., application processor 100) before the operation speed of memory device 400 is changed.

The internal control signal Ctrl_int may correspond to a control signal to increase or decrease the voltage level, and thus it is determined whether the level of the operation voltage Vol_int is increased or decreased by the internal control signal Ctrl_int. For instance, when the operation speed is changed to the low-speed from the high-speed, it is determined that the level of the operation voltage is decreased. That is, it is determined that memory device 400 is being currently operated at the high-speed, and will be operated at the low-speed after a predetermined time period lapses.

In a case that the internal control signal Ctrl_int corresponds to the control signal to decrease the level of the operation voltage, voltage adjustment unit 430 may maintain the level of the operation voltage Vol_int in a high voltage state without decreasing the level of the operation voltage Vol_int even though the internal control signal Ctrl_int is applied thereto. Then, when the operation speed of memory device 400 is changed to the low speed, memory device 400 may receive the clock signal having a relatively low frequency from the application processor. When the detected result Det_freq according to the change in frequency of the clock signal is provided to voltage adjustment unit 430, voltage adjustment unit 430 may decrease the level of the operation voltage Vol_int and may output the operation voltage Vol_int at the decreased level. Accordingly, the level of the operation voltage Vol_int may be prevented from decreasing while memory device 400 is still being operated at the high speed.

FIG. 10B shows an example in which the operation speed of memory device 400 is changed from the low-speed from the high speed.

According to the internal control signal Ctrl_int, it may be determined that the level of the operation voltage Vol_int is increased. That is, it is determined that memory device 400 is being currently operated at the low-speed and will be operated at the high-speed after a predetermined time period lapses.

Voltage adjustment unit 430 may increase the level of the operation voltage Vol_int in response to the reception of the internal control signal Ctrl_int and may output the operation voltage Vol_int. That is, the level of the operation voltage Vol_int may be increased before the detected result Det_freq according to the change of the frequency is received.

Then, when the operation speed of memory device 400 is changed from the low-speed to the high-speed, memory device 400 may receive the clock signal having a relatively high frequency from the application processor. According to the above-mentioned operation, since the level of the operation voltage Vol_int may be increased before operation speed of the memory device 400 is changed to the high speed, a deterioration of the memory operation performance, which is caused when the level of the operation voltage Vol_int does not enter the range of the level corresponding to the high-speed operation right after the operation speed is changed to the high-speed, may be prevented.

Figure 11:
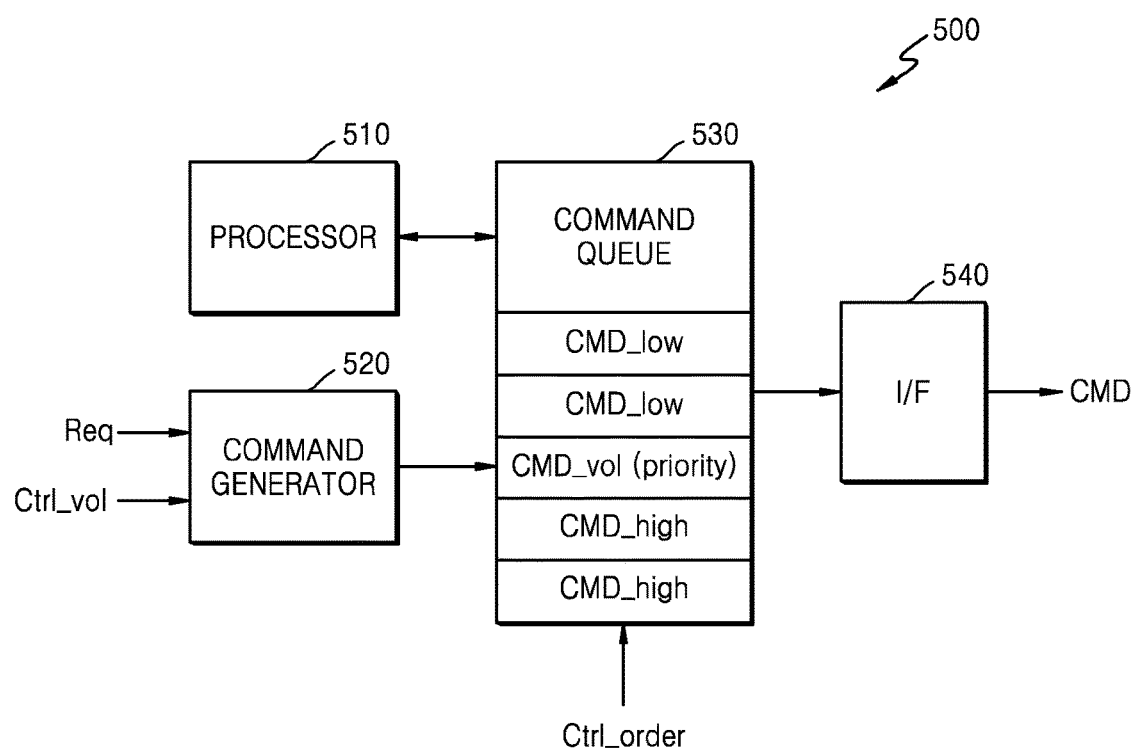
FIG. 11 is a block diagram showing an embodiment of a memory controller implemented in an application processor.

FIG. 11 is a block diagram showing a memory controller implemented in an application processor according to an embodiment. FIG. 11 shows an example in which a memory controller in an application processor (e.g., application processor 100) provides the voltage control signal according to the above-mentioned embodiment to a memory device (e.g., memory device 200, memory device 200a and/or memory device 400).

Referring to FIG. 11, a memory controller 500 may include a processor 510, a command generator 520, a command queue 530, and an interface unit 540. Although not shown in FIG. 11, memory controller 500 may further include various other functional blocks to control a memory device. In addition, FIG. 11 shows a representative example of a configuration of functional blocks of memory controller 500 and a transmission/reception relation between the functional blocks, but the configuration and the transmission/reception relation of the functional block should not be limited thereto or thereby. That is, although the configuration of functional blocks and the transmission/reception relation between the functional blocks are changed, various functions according to the present disclosure may be performed without being changed.

Processor 510 may control an overall operation of memory controller 500, and thus processor 510 may control the various functional blocks arranged in memory controller 500. In addition, command generator 520 may generate a command in accordance with an access request (e.g., a memory access request) Req from a host, and may generate the voltage control command CMD_vol in accordance with the voltage control signal Ctrl_vol from a DVFS controller, such as DVFS controller 120 described above. Various commands generated by command generator 520 may be stored in command queue 530.

An output order of the commands stored in command queue 530 may be controlled by processor 510. For instance, the output order of the commands stored in command queue 530 may be controlled with reference to information on the commands stored in command queue 530 and output status of the commands According to an embodiment, processor 510 may generate an order control signal Ctrl_order with reference to the information and the output status of the commands.

Command queue 530 may store various types of commands in association with the memory operation. As an example, memory controller 500 may change the operation speed in accordance with the number (or the workload) of the commands stored in command queue 530, and thus command queue 530 may store commands CMD_high to be operated at high speed and commands CMD_low to be operated at low speed. In addition, command queue 530 may store the voltage control command CMD_vol to adjust the level of the operation voltage of the memory device.

According to an embodiment, the output status of a command CMD from command queue 530 may be monitored, and an output timing of the command CMD may be adjusted according to the monitored result. In the case that the operation of the memory device is changed to the high-speed from the low-speed, it is monitored whether the voltage control command CMD_vol stored in command queue 530 has been output. In a case that the voltage control command CMD_vol has not yet been output, the monitoring may be performed on the voltage control command CMD_vol, and the commands CMD_high, to be operated at high-speed, may be output after the voltage control command CMD_vol is output.

Meanwhile, according to another embodiment, a priority may be added to the voltage control command CMD_vol when command generator 520 generates the voltage control command CMD_vol. The voltage control command CMD_vol may be output earlier than one or more other commands stored in command queue 530 with reference to the priority. In the case that the operation of the memory device is changed to the high-speed from the low-speed, the voltage control command CMD_vol may be output earlier than at least the commands CMD_vol which are to be operated at the high speed, in accordance with the priority. Accordingly, the memory device may adjust the level of the operation voltage before the speed of the memory operation is changed.

Figure 12:
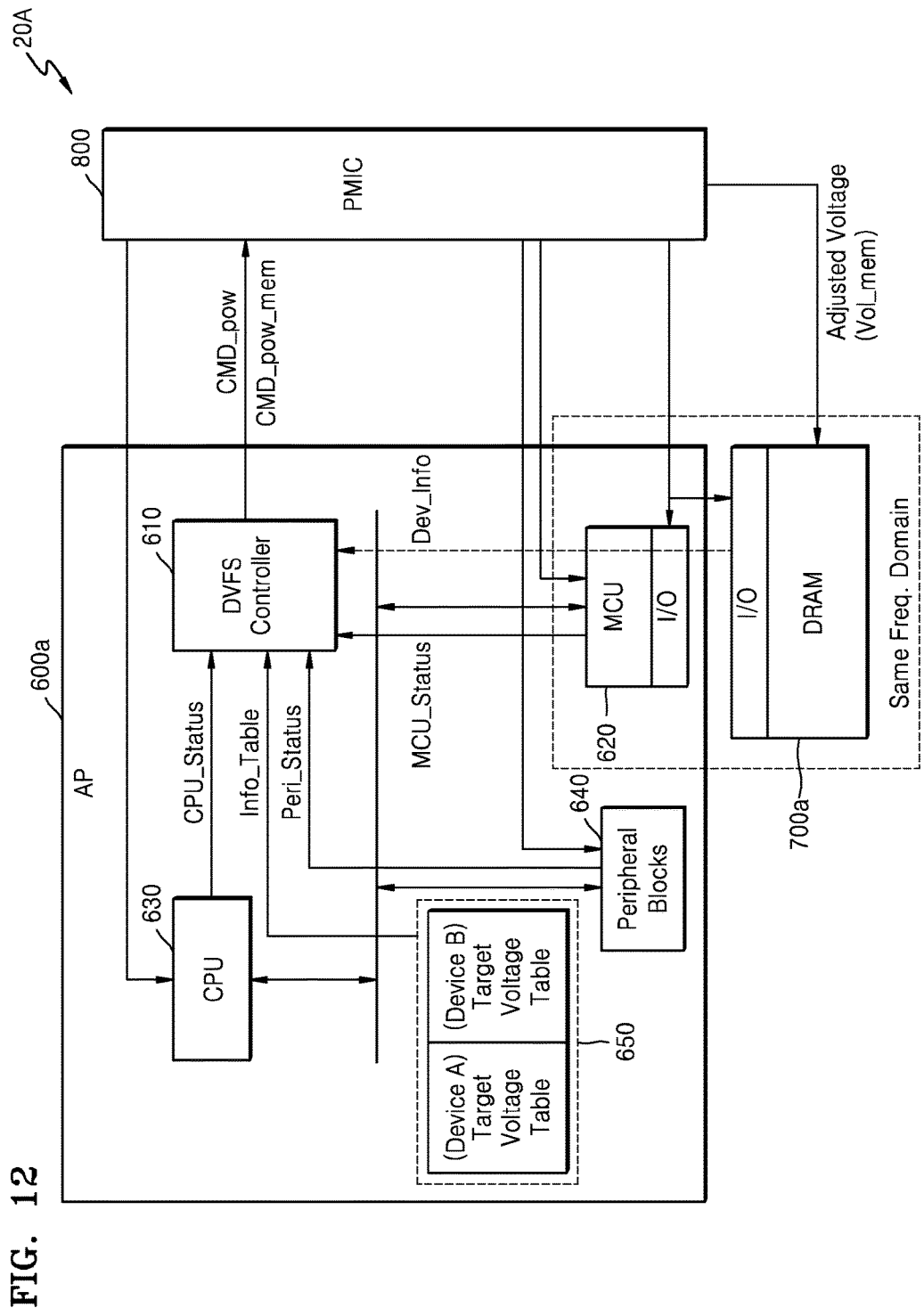
FIGS. 12 and 13 are block diagrams showing other embodiments of a data processing system.
Figure 13:
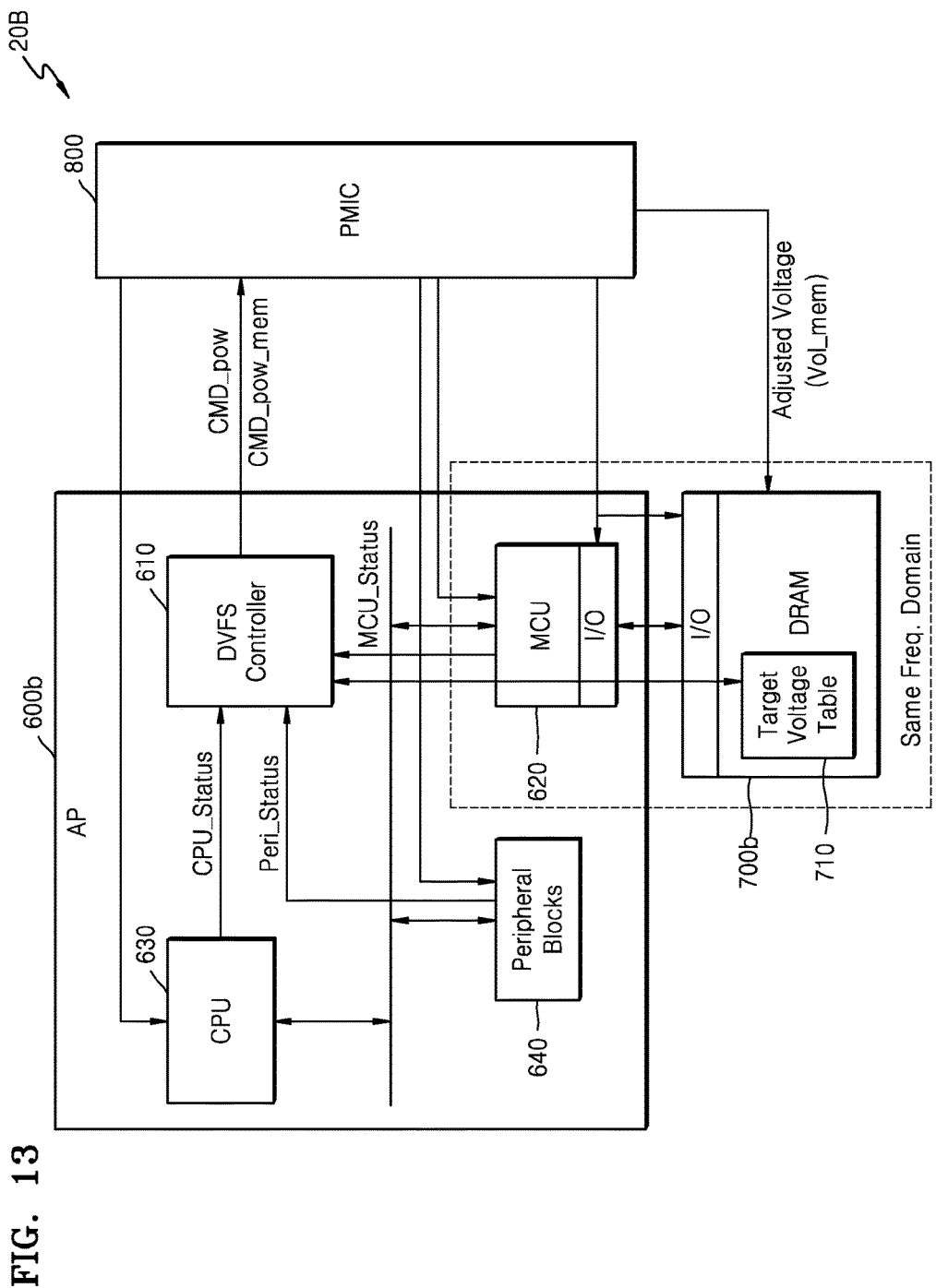

FIGS. 12 and 13 are block diagrams showing other embodiments of a data processing system. In the following descriptions of the data processing system shown in FIGS. 12 and 13, detailed descriptions of the same elements as those in the above-mentioned embodiments will be omitted.

Referring to FIG. 12, a data processing system 20A may include an application processor 600a, a memory device 700a, and a PMIC 800. Application processor 600a may include a DVFS controller 610, a memory controller (MCU) 620, a central processing unit 630, a peripheral block 640, and an information storing unit 650. The above-mentioned various functional blocks included in application processor 600a may communicate with each other through a system bus.

DVFS controller 610 may provide a power adjustment command CMD_Pow to PMIC 800 in accordance with an operation status of the functional blocks included in application processor 600 to adjust a level of a power source voltage provided to the functional blocks. As an example, in the case that the operation speed of the various functional blocks arranged in application processor 600a is changed, DVFS controller 610 may provide the power adjustment command CMD_Pow to PMIC 800 to allow the power source voltage appropriate to the changed operation speed of the functional blocks to be applied to the functional blocks. As in the above-described embodiment, DVFS controller 610 may receive status information CPU_Status from central processing unit 630 and status information Peri_Status from peripheral blocks 640.

In addition, memory controller 620 and memory device 700 may be operated in the same frequency domain, and thus memory controller 620 and memory device 700a may have the same operation speed. Memory controller 620 may provide the status information MCU_Status to DVFS controller 610, and DVFS controller 610 may provide the power adjustment command CMD_Pow to PMIC 800 to adjust the level of the power source voltage provided to memory controller 620.

According to the embodiment illustrated in FIG. 12, DVFS controller 610 may provide a memory power adjustment command CMD_Pow_mem to PMIC 800 to adjust the level of the power source voltage provided to memory device 700 in accordance with the status information MCU_Status from memory controller 620. In data processing system 20A, PMIC 800 may adjust the level of the power source voltage Vol_mem provided to memory device 700a in accordance with the memory power adjustment command CMD_Pow_mem.

According to the above-mentioned embodiment, since memory device 700a may receive the power source voltage Vol_mem, in which the level thereof is already adjusted, from PMIC 800 before the operation speed of memory device 700 is changed, the memory operation may be executed at the operation voltage having the level suitable for the operation speed, and thus a reliability of the memory operation may be prevented from being deteriorated.

According to an embodiment, information storing unit 650 may store table information (e.g., a target voltage table) on a voltage level according to an operation speed with respect to one or more devices. For instance, information storing unit 650 may store the table information regarding one or more memory devices, which may be the same or different kinds of memory devices. Information storing unit 650 may include various types of storing units, and as an example, information storing unit 650 may include a storing unit that non-volatilely stores information, e.g., a fuse array. In FIG. 12, information storing unit 650 may store the table information for two memory devices (device A and B), but the number of the memory devices should not be limited to two.

According to an embodiment, memory device 700a may provide device information Dev_Info to DVFS controller 610 through memory controller 620. The device information Dev_Info may include at least one of information on a manufacturer, a product name, and a process revision ID with respect to memory device 700a. DVFS controller 610 may determine the kind of memory device 700a connected to application processor 600a on the basis of the device information Dev_Info and may read out the table information matched with memory device 700a from information storing unit 650. Then, in the case that the operation speed of memory device 700a is changed, DVFS controller 610 may provide the memory power adjustment command CMD_Pow_mem to PMIC 800 with reference to the table information and the status information MCU_Status provided from memory controller 620 to adjust the level of the power source voltage Vol_mem provided to memory device 700a.

According to an embodiment, in the case that memory device 700a does not provide the device information Dev_Info, or the table information matched with the device information Dev_Info are not stored in information storing unit 650, DVFS controller 610 may not output the memory power control command CMD_Pow_mem.

Referring to FIG. 13, in a data processing system 20B the table information regarding the level of the operation voltage corresponding to the operation speed of a memory device 700b may be stored in memory device 700b. As an example, memory device 700b may include an information storing unit 710, e.g., a fuse array, that non-volatilely stores the information, and the table information regarding the level of the operation voltage corresponding to the operation speed of memory device 700b may be provided to DVFS controller 610 of an application processor 600b from information storing unit 710.

FIGS. 14A and 14B embodiments of table information and device information associated with the level of the operation voltage corresponding to an operation speed.

Referring to FIGS. 12, 13, 14A, and 14B, DVFS controller 610 may provide various commands CMD_Pow and CMD_Pow_mem to PMIC 800 on the basis of the table information as shown in FIG. 14A. The command CMD_Pow may correspond to a command that adjusts the level of the power source voltage provided to the various functional blocks in application processor 600a/600b, and the command CMD_Pow_mem may correspond to a command that adjusts the level of the power source voltage provided to memory device 700a/700b.

DVFS controller 610 may transmit one command CMD_Pow among commands CPU_A, CPU_B, CPU_C, and CPU_D in accordance with the status information CPU_Status from central processing unit 630. PMIC 800 may supply the power source voltage corresponding to the transmitted command CMD_Pow to central processing unit 630. That is, when PMIC 800 receives the command CPU_A, PMIC 800 may set the power source voltage provided to central processing unit 630 to a voltage level VDD1 corresponding to CPU_A. In addition, DVFS controller 610 may generate a signal to control a clock generator (not shown) disposed inside (or outside) the application processor, and thus DVFS controller 610 may control the clock generator to provide a clock signal having a frequency CLK1 to central processing unit 630.

In addition, DVFS controller 610 may transmit one command CMD_Pow among commands Peri_A and Peri_B in accordance with the status information Peri_Status from peripheral blocks 640. PMIC 800 may supply the power source voltage corresponding to the transmitted command CMD_Pow to peripheral blocks 640. That is, when PMIC 800 receives the command Peri_B, PMIC 800 may set the power source voltage provided to peripheral blocks 640 to a voltage level VDD2 corresponding to Peri_B. In addition, DVFS controller 610 may control the clock generator disposed inside or outside the application processor to provide a clock signal having a frequency CLK2 to peripheral block 640.

Further, DVFS controller 610 may transmit one command CMD_Pow among commands MCU_A, MCU_B, and MCU_C in accordance with the status information MCU_Status from memory controller 620. PMIC 800 may supply the power source voltage corresponding to the transmitted command CMD_Pow to memory controller 620. That is, when PMIC 800 receives the command MCU_C, PMIC 800 may set the power source voltage provided to memory controller 620 to a voltage level VDD3 corresponding to MCU_C. In addition, DVFS controller 610 may control the clock generator disposed inside or outside the application processor to provide a clock signal having a frequency CLK3 to memory controller 620.

In addition, DVFS controller 610 may further transmit the command CMD_Pow_mem to PMIC 800 to adjust the level of the power source voltage provided to memory device 700a/700b in response to the adjustment of the power source voltage with respect to memory controller 620. For example, PMIC 800 may set the power source voltage provided to memory device 700a/700b to a voltage level VDD3.

Meanwhile, as shown in FIG. 14B, memory device 700a/700b may store the device information Dev_Info, and as an example, memory device 700 may store the above-mentioned device information in a mode register set (MRS). The device information Dev_Info may include information on the manufacturer, the product name, and the process revision ID with respect to memory device 700. The process revision ID may include process information on memory device 700. Further, the device information Dev_Info may further include voltage level information according to the process revision ID.

Figure 15:
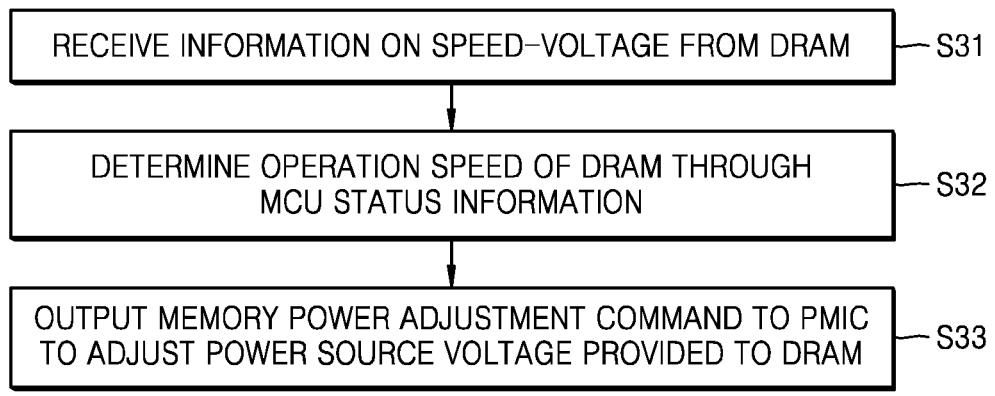
FIGS. 15 and 16 are flowcharts of embodiments of operating methods of an application processor.
Figure 16:
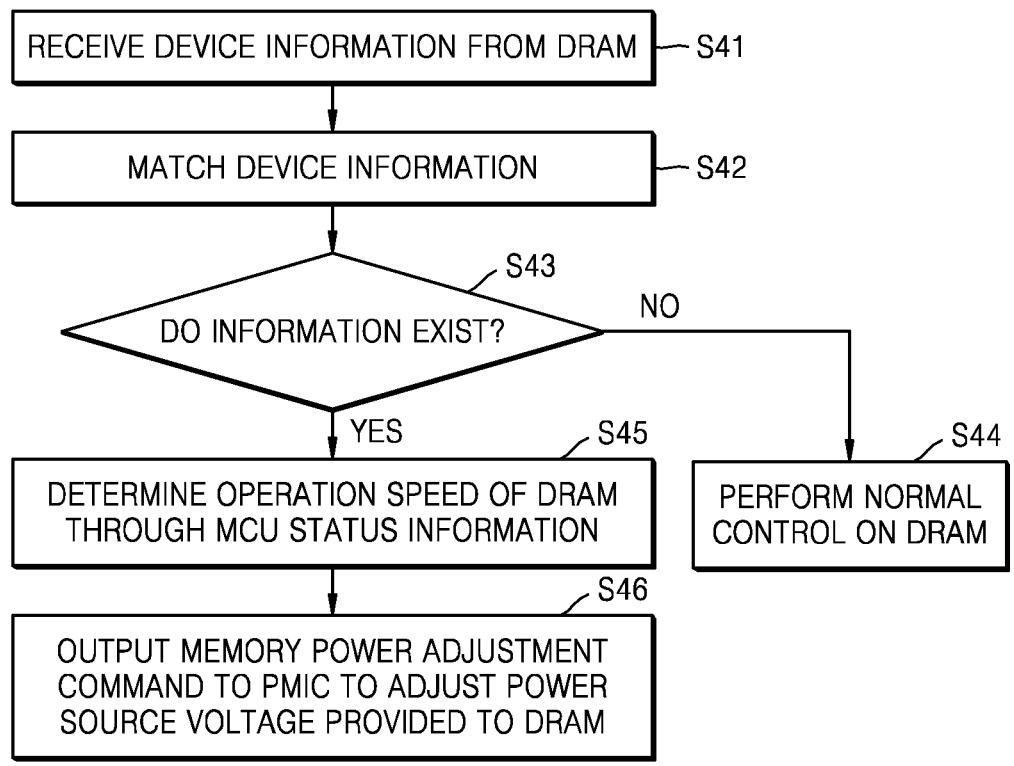

FIGS. 15 and 16 are flowcharts of embodiments of operating methods of an application processor (e.g., application processor 600a and/or application processor 600b). FIGS. 15 and 16 show an example in which the application processor communicates with a DRAM.

Referring to FIG. 15, the application processor may receive the information associated with the operation voltage level corresponding to the operation speed from the DRAM (S31), and the received information may be stored in the storing unit of the application processor or in a DVFS controller (e.g., DVFS controller 610) of the application processor. In addition, a memory controller (e.g., memory controller 620) of the application processor may change the speed of the memory operation in accordance with the workload on the DRAM, and the memory controller may provide the MCU status information based on the workload to the DVFS controller. The MCU status information may include information indicating the speed of the memory operation, and the DVFS controller may determine the operation speed of the DRAM through the MCU status information since the memory controller and the DRAM may be operated in the same frequency domain (S32). The memory controller may output the MCU status information to the DVFS controller and may change the frequency of the clock signal provided to the DRAM after a predetermined time lapses.

The application processor may output the power adjustment command to a PMIC (e.g., PMIC 800) in accordance with the MCU status information to adjust the level of the power source voltage provided to the memory controller. In addition, the application processor may provide the memory power adjustment command to the PMIC in accordance with the MCU status information to adjust the level of the power source voltage provided to the DRAM (S33). Preferably, responsive to the memory power adjustment command, the PMIC may provide the level-adjusted power source voltage to the DRAM before the operation speed of the DRAM is changed.

Referring to FIG. 16, the application processor may receive the device information from the DRAM (S41), and similar to the above-mentioned embodiment, the device information may include at least one of information on the manufacturer, the product name, and the process revision ID with respect to the DRAM. In addition, the application processor may store the table information associated with the operation voltage level corresponding to an operation speed with respect to a plurality of devices (e.g., DRAMs).

Each of the tables may further store the information regarding a corresponding DRAM, and the information may include at least one of the information included in the device information.

The device information provided from the DRAM may be matched with the table information (S42), and it is determined whether the matched information exists according to the matched result (S43). In the case that the matched information does not exist, a normal control may be performed on the DRAM (S44), and thus the PMIC may provide the constant power source voltage to the DRAM regardless of the operation speed of the DRAM.

On the other hand, in the case that the matched information exists, the matched table information may be read out and provided to the DVFS controller of the application processor. In addition, the MCU status information may be provided to the DVFS controller, and the DVFS controller may determine the operation speed of the DRAM through the MCU status information (S45). Similar to the above-mentioned embodiment, the application processor may output the memory power adjustment command to the PMIC in accordance with the MCU status information to adjust the level of the power source voltage provided to the DRAM.

Figure 17:
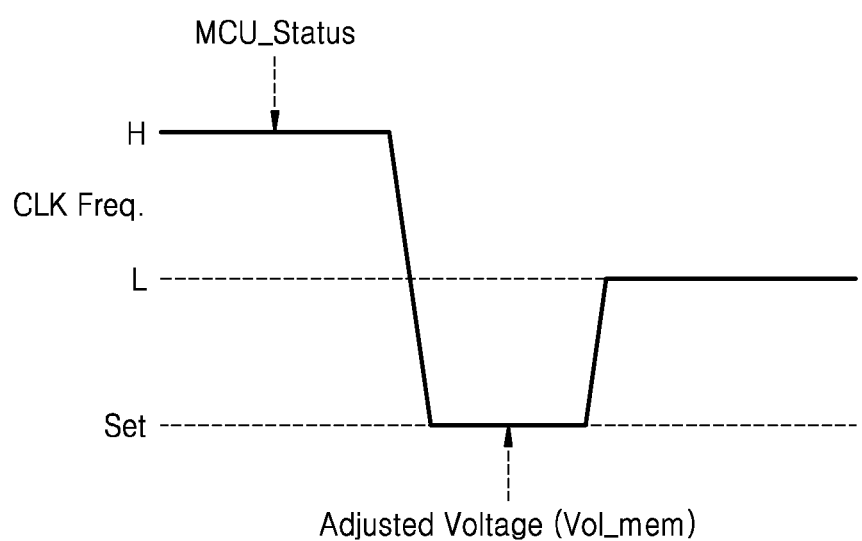
FIGS. 17 and 18 are views illustration an operation of embodiments of an application processor.
Figure 18:
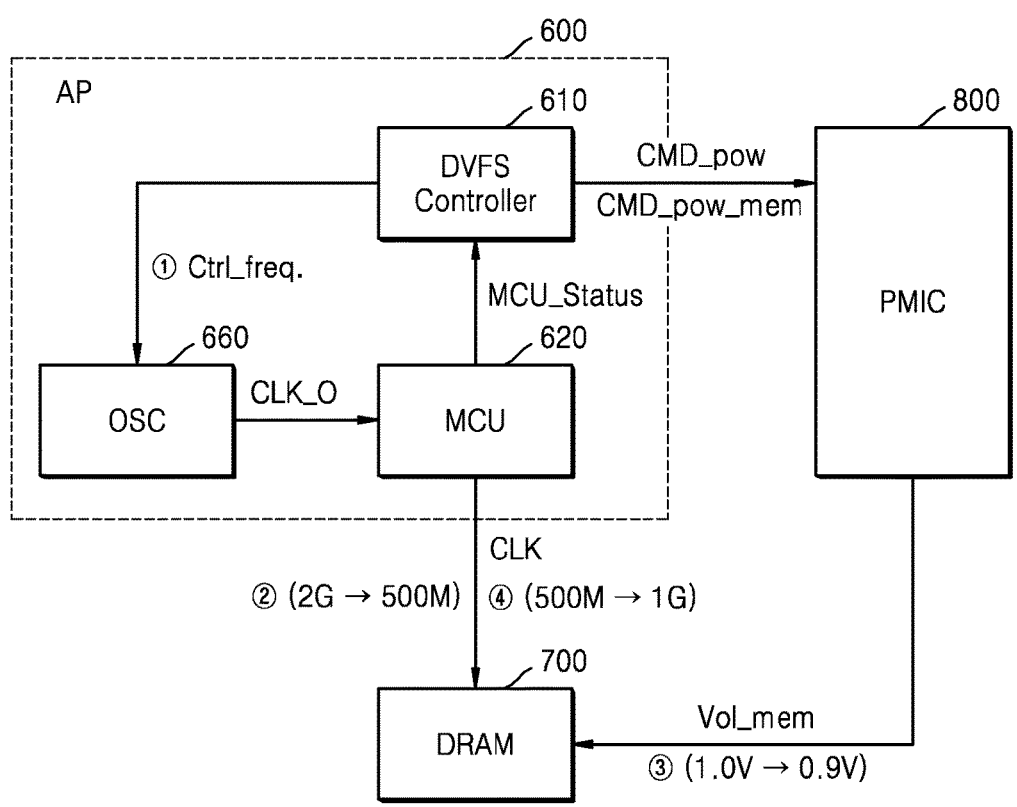

FIGS. 17 and 18 are views illustrating an operation of embodiments of an application processor. FIGS. 17 and 18 show an example in which the memory controller changes the frequency of the clock signal. In addition, FIGS. 17 and 18 show an example in which the speed of the memory operation is changed to the low-speed from the high-speed. Hereinafter, the operation according to the illustrated embodiments will be described with reference to data processing systems 20A and 20B shown in FIGS. 12 and 13.

In the memory operation, as the frequency of the clock signal (or an operation clock) decreases, a window of the signal may be widely secured, and thus a margin of signal transmission/reception of data and address between memory controller 620 and the memory device may increase. According to the illustrated embodiments, in the case that the level of the power source voltage Vol_mem applied to memory device 700 is adjusted, a stability of the signal transmission/reception needs to be secured in the level-adjusted operation voltage.

When the operation speed of memory device 700 is changed to the low-speed from the high-speed, memory device 700 according to the illustrated embodiments may receive the power source voltage Vol_mem in which the level thereof decreases before the operation speed is changed (or before the frequency of the received clock signal is changed). In this case, unless other provisions are made, the level of the power source voltage Vol_mem may decrease while memory device 700 performs the memory operation, e.g., a reading command, a writing command, etc., at the high-speed.

To improve the data stability in the above-mentioned embodiment, the operation speed of memory device 700 may be differently controlled in a predetermined period including a time point at which the level of the power source voltage Vol_mem is adjusted. For instance, referring to FIG. 7, memory controller 620 may provide a clock signal CLK having a high frequency H to memory device 700, and memory controller 620 may provide the status information to DVFS controller 610 by determining that the speed of the memory operation is changed to the low-speed from the high-speed according to the above-mentioned embodiment. In addition, according to the above-mentioned embodiment, since DVFS controller 610 may provide various commands to PMIC 800, the level of the power source voltage provided to memory controller 620 and memory device 700 may be adjusted.

Memory controller 620 may provide the status information MCU_Status and may adjust the frequency of the clock signal CLK provided to memory device 700 to a set value "Set" lower than a low frequency L. Since memory device 700 may receive the clock signal CLK having the value "Set" lower than the low frequency L and may receive the signal from memory controller 620 due to the clock signal CLK, a margin to latch the received signal may increase. That is, since the level of the power source voltage Vol_mem provided to memory device 700 may be adjusted in the period in which the margin increases, the data may be stably transmitted and received even though the level of the power source voltage Vol_mem is adjusted before the operation speed is changed.

FIG. 18 is a block diagram showing an example of the memory operation as shown in FIG. 17. In the example shown in FIG. 18, the high-speed memory operation may be performed in response to the clock signal CLK of about 2 GHz, and the low-speed memory operation may be performed in response to the clock signal CLK of about 1 GHz, but they should not be limited thereto or thereby. That is, the speed of the memory operation may be defined in various ways.

Referring to FIG. 18, memory controller 620 may provide the status information MCU_Status to DVFS controller 610, and DVFS controller 610 may provide a clock control signal Ctrl_freq to the clock generator, e.g., an oscillator 660. Accordingly, a frequency of a signal, e.g., an oscillation signal CLK_O, generated by clock generator 660 may be controlled. In addition, DVFS controller 610 may output the command CMD_Pow_mem to adjust the level of the power source voltage Vol_mem provided to memory device 700.

Memory controller 620 may receive the signal CLK_O having the reduced frequency from clock generator 660 while providing the clock signal CLK having the frequency of 2 GHz. Memory controller 620 may provide the clock signal CLK having a frequency (e.g., about 500 MHz) lower than that of the clock signal CLK to memory device 700 before memory controller 620 outputs the clock signal CLK for the low-speed memory operation.

Then, PMIC 800 may provide the level-adjusted power source voltage Vol_mem to memory device 700 according to the above-mentioned embodiment, and the power source voltage Vol_mem may decrease to about 0.9 volts from about 1.0 volts. That is, memory device 700 may be operated at a speed lower than the low-speed (e.g., about 1 GHz) at a time point at which the level of the power source voltage Vol_mem is adjusted, and memory controller 620 may provide the clock signal CLK having the frequency corresponding to the low-speed memory operation to memory device 700.

Figure 19:
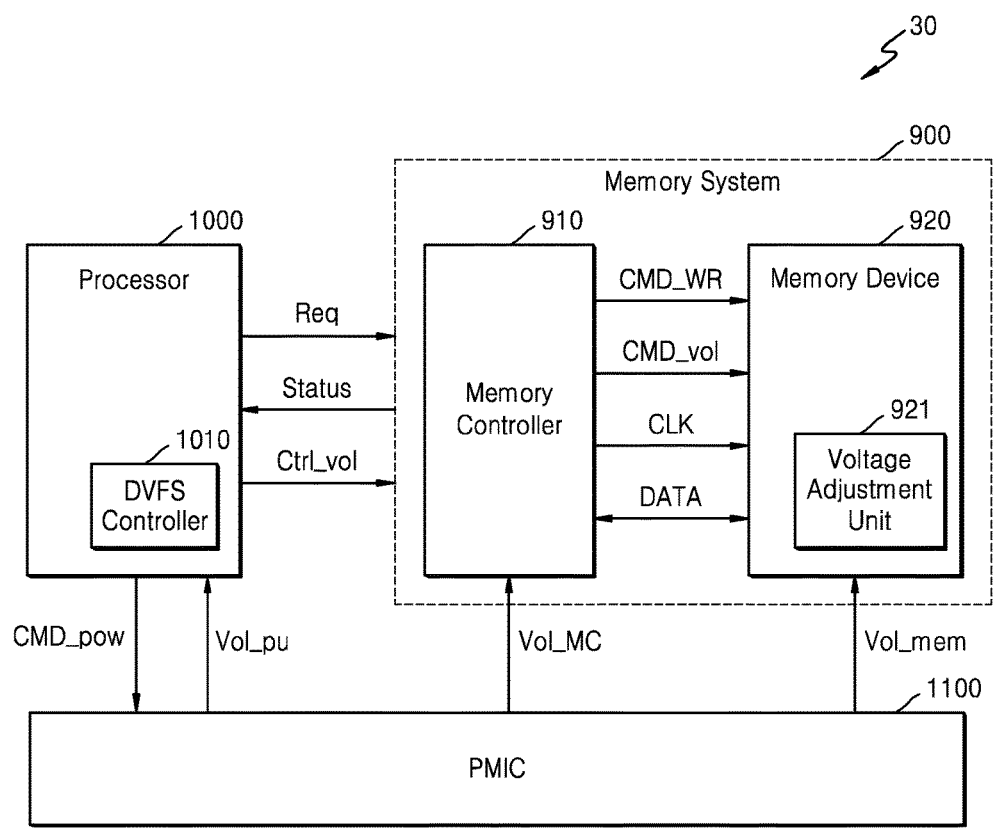
FIG. 19 is a block diagram showing an embodiment of a data processing system.

FIG. 19 is a block diagram showing a data processing system 30 according to embodiments.

Referring to FIG. 19, data processing system 30 may include a memory system 900, a processor 1000, and a PMIC 1100. Memory system 900 may include a memory controller 910 and a memory device 920. Memory system 900 may include various types of memories. According to some embodiments, memory system 900 may be a DRAM system, but other embodiments exist. That is, various types of memories as arranged in data processing system 30 may be applied to memory system 900. According to some embodiments, memory system 900 may include non-volatile memory.

Memory controller 910 may perform at least some of the functions of the memory controllers according to the above-mentioned embodiments (e.g., memory controller 120). According to an embodiment, memory controller 910 may communicate with memory device 920 in accordance with a request Req received from processor 1000 to control an operation of the memories, provide a write/read command CMD_WR and a clock signal CLK to memory device 920, and transmit and receive data DATA to and from memory device 920. In addition, according to the present embodiment, memory controller 910 may output a voltage adjustment command CMD_vol to memory device 920. Further, according to the present embodiment, memory device 920 may include a voltage adjustment unit 921.

Processor 1000 may perform at least some of the functions of application processor 100 according to the above-mentioned embodiments. According to an embodiment, application processor 1000 may be an SoC. In addition, according to present embodiment, processor 1000 may include a DVFS controller 1010. Further, PMIC 1100 may provide one or more power source voltages to various elements of data processing system 30. According to an embodiment, PMIC 110 may provide a power source voltage Vol_pu to processor 1000, a power source voltage Vol_MC to memory controller 910, and a power source voltage VOL_mem to memory device 920, respectively.

Memory controller 910 may determine an operation status of memory system 900 and provide status information "Status" according to the determined result to processor 1000. DVFS controller 1010 may determine the level of the operation voltage corresponding to the operation speed of memory system 900 with reference to the status information "Status" in accordance with the above-mentioned various methods. DVFS controller 1010 may provide the power adjustment command CMD_Pow corresponding to the status information "Status" to PMIC 1100. In addition, DVFS controller 1010 may provide a voltage control signal Ctrl_vol to memory system 900 to adjust the level of the operation voltage of memory device 920.

PMIC 1100 may change the level of the power source voltage Vol_MC provided to memory controller 910 in response to the power adjustment command CMD_Pow. On the other hand, PMIC 1100 may provide the power source voltage Vol_mem having a constant level to memory device 920.

Memory controller 910 may generate a voltage control command CMD_vol on the basis of the voltage control signal Ctrl_vol and output the voltage control command CMD_vol to memory device 920. Similar to the above-mentioned embodiment, voltage adjustment unit 921 may adjust the level of the operation voltage in memory device 920 on the basis of the voltage control command CMD_vol received from memory controller 910. According to an embodiment, voltage adjustment unit 921 may adjust the level of the power source voltage Vol_mem provided from PMIC 1100.

In the above-mentioned embodiment, PMIC 1100 may provide the power source voltage Vol_mem having the constant level to memory device 920, but the present embodiment is not limited thereto. According to the embodiments shown in FIGS. 12 and 13, PMIC 1100 may adjust the level of the power source voltage Vol_mem provided to the memory device 920, and DVFS controller 1010 may provide the power adjustment command CMD_Pow to PMIC 1100 to allow the level of the power source voltage Vol_mem to be adjusted.

Figure 20:
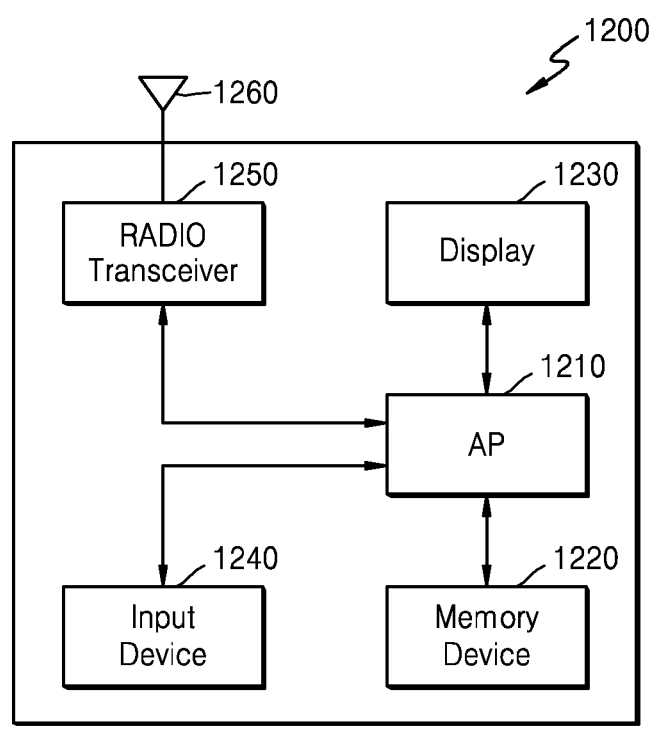
FIG. 20 is a block diagram showing an embodiment of a computer system including an application processor.

FIG. 20 is a block diagram showing an embodiment of a computer system 1200 including an application processor.

Referring to FIG. 20, computer system 1200 may include an application processor 1210, a memory device 1220, a display 1230, an input device 1240, and a radio transceiver 1250.

Radio transceiver 1250 may transmit or receive a radio signal through an antenna 1260. According to an embodiment, radio transceiver 1250 may convert the radio signal provided through antenna 1260 into a signal that may be processed by application processor 1210.

Accordingly, application processor 1210 may process the signal output from radio transceiver 1250 and transmit the processed signal to display 1230. In addition, radio transceiver 1250 may convert the signal output from application processor 1210 into the radio signal and may output the converted radio signal to an external device through antenna 1260.

Input device 1240 may input a control signal for controlling an operation of application processor 1210 or data processed by application processor 1210. According to an embodiment, input device 1240 may be a pointing device, such as a touch pad, a computer mouse, etc., a keypad, or a keyboard.

According to an embodiment, application processor 1210 may include the memory controller (not shown) according to the above-mentioned embodiments to control memory device 1220 and may also include the DVFS controller (not shown) according to the above-mentioned embodiments to change the operation voltage of memory device 1220. In addition, memory device 1220 may change the level of the operation voltage in response to the voltage control signal from application processor 1210. Although not shown in FIG. 20, PMIC 1100 may be further arranged in computer system 1200 to provide power to various elements in computer system 1200.

While the inventive concept has been particularly shown and described with reference to embodiments thereof, it will be understood that various changes in form and details may be made therein without departing from the spirit and scope of the following claims.

What is claimed is:
1. A memory device, comprising:
  a receiving terminal configured to receive a voltage control signal from an external source, the voltage control signal being for adjusting a level of an operation voltage in the memory device according to an operation speed of the memory device; and
  a voltage adjustment unit configured to adjust the level of the operation voltage of the memory device in response to the voltage control signal, wherein the level of the operation voltage is adjusted before a memory operation is performed at an operation speed corresponding to the adjusted operation voltage.
2. The memory device of claim 1, further comprising an interface unit configured to communicate with an external memory controller, wherein the receiving terminal comprises at least one terminal from among a plurality of terminals configured to receive signals from the external memory controller through the interface unit.
3. The memory device of claim 1, wherein the voltage control signal is provided from a dynamic voltage and frequency scaling (DVFS) controller of an application processor configured to communicate with the memory device, and the voltage adjustment unit is configured to generate the adjusted operation voltage by adjusting a power source voltage provided to the memory device by an external power management integrated circuit.

4. The memory device of claim 3, wherein the receiving terminal comprises one or more dedicated terminals configured to directly receive the voltage control signal from the DVFS controller.

5. The memory device of claim 1, wherein the level of the operation voltage is changed in response to the voltage control signal to a level corresponding to a second operation speed while the memory operation is performed at a first operation speed, and the receiving terminal is configured to receive the voltage control signal before a clock signal having a frequency corresponding to the second operation speed is received by the memory device.

6. The memory device of claim 1, further comprising a frequency detector configured to detect a frequency of a clock signal provided to the memory device from a memory controller, wherein the voltage adjustment unit is configured to change a timing of the adjustment of the operation voltage level on the basis of a determined result of the voltage control signal and the detected frequency of the clock signal.

7. The memory device of claim 6, wherein, when the operation speed of the memory operation is changed to a low-speed from a high-speed according to the determined result of the voltage control signal, the level of the operation voltage decreases after the clock signal having a decreased frequency is received, and when the operation speed of the memory operation is changed to the high-speed from the low-speed according to the determined result of the voltage control signal, the level of the operation voltage increases before the clock signal having an increased frequency is received.

8. The memory device of claim 1, further comprising a storing unit configured to store table information indicating a relation between the operation speed and the operation voltage of the memory device, wherein the table information is provided by the memory device to an external application processor.

9. An application processor, comprising:
a memory controller configured to control a memory operation of a memory device;
a dynamic voltage and frequency scaling (DVFS) controller configured to: receive status information associated with an operation speed from the memory controller, output a power adjustment command, based on the status information, for adjusting a power source voltage provided to the memory controller, and output a voltage control signal based on the status information for adjusting a level of an operation voltage of the memory device; and
at least one output terminal configured to provide the voltage control signal to the memory device.

10. The application processor of claim 9, wherein the status information associated with the operation speed is generated on the basis of a workload of commands stored in a command queue in the memory controller.

11. The application processor of claim 9, wherein the memory controller comprises an interface unit configured to output a signal to the memory device through a plurality of first terminals and to receive the voltage control signal from the DVFS controller to thereby generate a memory power adjustment command, and the output terminal comprises at least one terminal of the plurality of first terminals and is configured to provide the voltage control signal via the memory power adjustment command.

12. The application processor of claim 9, wherein the at least one output terminal comprises one or more dedicated terminals configured to directly output the voltage control signal to the memory device.

13. The application processor of claim 9, wherein the DVFS controller is configured to output the voltage control signal so that the memory device changes the level of the operation voltage to a level corresponding to a second operation speed while the memory controller provides to the memory device a clock signal having a first frequency corresponding to a first operation speed.

14. The application processor of claim 13, wherein the DVFS controller is configured to provide the voltage control signal to the memory device before the memory controller provides the clock signal having a second frequency corresponding to the second operation speed to the memory device.

15. The application processor of claim 9, wherein the DVFS controller is configured to receive from the memory device table information indicating a relation between the operation speed and the operation voltage, and to generate the voltage control signal with reference to the status information and the table information.

16. An application processor, comprising:
a memory controller configured to control a memory operation of a memory device;
a dynamic voltage and frequency scaling (DVFS) controller configured to:
receive status information associated with an operation speed from the memory controller,
output a first signal, based on the status information, for adjusting a power source voltage provided from an external device to the memory controller, and
output a second signal, based on the status information, for adjusting a level of an operation voltage of the memory device; and
one or more output terminals configured to output the first and second signals.

17. The application processor of claim 16, wherein the memory controller comprises an interface unit configured to output a signal to the memory device through a plurality of first terminals and to receive the second signal from the DVFS controller to generate a memory power adjustment command, and the one or more output terminals comprises at least one terminal of the plurality of first terminals and is configured to provide the second signal via the memory power adjustment command.

18. The application processor of claim 16, wherein the one or more output terminals comprises one or more dedicated terminals configured to directly output the second signal to the memory device.

19. The application processor of claim 16, wherein the one or more output terminals comprises one or more dedicated terminals configured to directly output the second signal to a power management interface circuit external to the memory device, wherein the power management interface circuit outputs an adjusted voltage to the memory device, the adjusted voltage having a level which is adjusted in response to the second signal.

20. The application processor of claim 16, wherein the DVFS controller is configured to output the second signal so that the memory device changes the level of the operation voltage to a level corresponding to a second operation speed while the memory controller provides to the memory device a clock signal having a first frequency corresponding to a first operation speed.

* * * * *